United States Patent
Yu et al.

(10) Patent No.: US 6,225,171 B1
(45) Date of Patent: May 1, 2001

(54) SHALLOW TRENCH ISOLATION PROCESS FOR REDUCED FOR JUNCTION LEAKAGE

(75) Inventors: Chen-Hua Yu; Syun-Ming Jang, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/192,521

(22) Filed: Nov. 16, 1998

(51) Int. Cl.[7] ............ H01L 21/336; H01L 21/76; H01L 21/31
(52) U.S. Cl. ............ 438/296; 438/404; 438/424; 438/778
(58) Field of Search ................. 438/296, 404, 438/424, 778

(56) References Cited

U.S. PATENT DOCUMENTS

| | | | |
|---|---|---|---|
| 5,112,772 | 5/1992 | Wilson et al. | 437/67 |
| 5,208,179 | 5/1993 | Okazawa | 437/52 |
| 5,316,965 | 5/1994 | Philipossian et al. | 437/70 |
| 5,447,884 | 9/1995 | Fahey et al. | 437/67 |
| 5,492,858 | 2/1996 | Bose et al. | 437/67 |
| 5,741,740 | * 4/1998 | Jang et al. | |
| 5,811,347 | * 9/1998 | Gardner et al. | |
| 5,985,735 | * 11/1999 | Moon et al. | |

OTHER PUBLICATIONS

Wolf, S and Tauber, R. Silicon Processing for the VLSI Era, vol. 1 Lattice Press, p. 198, 1986.*

* cited by examiner

Primary Examiner—John F. Niebling
Assistant Examiner—Josetta I. Jones
(74) Attorney, Agent, or Firm—George O. Saile; Stephen B. Ackerman; Billy J. Knowles

(57) ABSTRACT

A method of forming shallow trench isolation that reduces junction leakage at the boundary of shallow trench isolation and contact metallurgy of adjacent transistors and that avoids a reduction of carrier concentration in the source and drain region of transistors adjacent to the shallow trench isolation is described. The method to form a shallow trench isolation feature begins by providing a semiconductor substrate having a surface coated with at least one layer of an insulating material and a plurality of shallow trenches formed in the surface of the semiconductor substrate. A nitrogen doped insulating layer is then grown on the internal surfaces or sidewalls of the shallow trenches. A gap fill insulating layer is deposited upon the surface of the semiconductor substrate to fill the shallow trenches, and the gap fill insulating layer is planarized to remove excess material of the gap fill insulating layer from the surface of the semiconductor substrate while leaving the gap fill insulating layer within the shallow trenches.

11 Claims, 3 Drawing Sheets

SHALLOW TRENCH ISOLATION PROCESS FOR REDUCED FOR JUNCTION LEAKAGE

BACKGROUND OF THE INVENTION

U.S. Pat. No. 6,010,948 (Yu, et al.) "A New Shallow-Trench-Isolation Process", issued Jan. 4, 2000, Assigned to the Same Assignee as the present invention.

1. Field of the Invention

The present invention relates to the manufacture of semiconductor devices and more particularly to the manufacture of shallow trench isolation (STI) features of integrated circuits.

2. Description of the Related Art

The structure and function of shallow trench isolation is well known in the art. Shallow trench isolation is commonly used to provide a very high resistance between circuit elements of an integrated circuit to effectively insulate the respective circuit elements from one another.

Shallow trench isolation is formed by selectively forming recesses or trenches 10 in the surface of the semiconductor substrate 5 as shown in FIG. 1a. The shallow trenches are filled with an insulating material such as silicon dioxide ($SiO_2$). Traditionally, the fill layer of silicon dioxide ($SiO_2$) is formed by chemical vapor deposition (CVD) of ozone assisted tetraethylorthosilane (03-TEOS) or a spun-on-glass (SOG) form of silicon dioxide. The fill oxide layer is planarized by chemical/mechanical planarization (CMP) or chemical etching of the silicon dioxide from the surface of the semiconductor substrate 5.

Stop layers of silicon nitride ($Si_xN_y$) 20 and silicon dioxide ($SiO_2$) 15 are striped to form the transistors of the integrated circuits. Impurity species such as boron (B) and arsenic (As) are diffused into the surface of the semiconductor substrate adjacent to the sidewalls of the trenches 10. These diffusions form the sources and drains of the transistors of integrated circuits.

The surface of the semiconductor substrate is then etched with dilute hydrofluoric acid (HF) to remove any residual oxides prior to the formation of the contact metallurgy on the sources and drains. The dilute hydrofluoric acid will additionally reduce the thickness of the fill oxide layer in the shallow trench.

Titanium, cobalt, or titanium nitride are alloyed to the surface of the semiconductor substrate at the sources and the drains of the transistors to form a titanium salicide ($TiSi_x$) or cobalt salicide ($CoSi_x$). The reduced thickness of the fill oxide layer causes increased junction leakage.

Further, in p-type sources and drains, the boron (B) implant species will diffuse into the fill oxide layer in the shallow trenches. This will cause a reduction in the carrier concentration in the p-type diffusions forming the sources and drains, thus further increasing the junction leakage of the transistors.

The semiconductor substrate is further processed to complete the metalization and final back end processing to form the integrated circuit.

U.S. Pat. No. 5,112,772 (Wilson et al.) discloses a method of fabricating a trench structure. The semiconductor substrate has a silicon dioxide layer, a polysilicon layer, and a silicon nitride layer formed on its surface. A trench is formed through the silicon dioxide ($SiO_2$) layer, the polysilicon layer, and the silicon nitride layer and into the semiconductor substrate. A dielectric liner is formed on the sidewalls of the trench, which is then filled with a trench fill material. Portions of the trench liner above the trench fill material are removed and a conformal layer is then formed on the trench structure. The conformal layer and a portion of the trench fill material are then oxidized.

U.S. Pat. No. 5,208,179 (Okazawa) teaches a method of fabricating a semiconductor integrated circuit such as a programmable read only memory (PROM) cell. The method begins with forming a first gate insulating film on a main surface of a semiconductor substrate. A first polysilicon layer, a second gate insulating film, and a second polysilicon layer are then deposited on the surface of the semiconductor substrate. Insulating trenches are then formed by selectively removing the second polysilicon layer, the second gate insulating film, the first polysilicon layer, the fast gate insulating film, and the semiconductor substrate. A borophososilicate glass (BPSG) film is formed over the entire surface filling the trenches. The BPSG film is selectively removed to leave it only in the trenches. In the prior art of Okazawa, the phosphorus and boron contained in the BPSG evaporated in response to a heat treatment used for forming the gate insulating film. Therefore, a portion of the evaporated phosphorus or boron was taken into the gate insulating film, which degraded the characteristics and the reliability of a PROM cell transistor. The invention grows the BPSG film after the first and second gate insulating film is formed. Hence, phosphorus or boron contained in the BPSG film is not taken into both of the gate insulating films.

U.S. Pat. No. 5,316,965 (Philipossian et al.) discloses an improved process for planarizing an isolation barrier in the fabrication of an integrated circuit on a semiconductor substrate. The process involves reducing the etch rate of the field oxide independently of the sacrificial oxide layer. The field oxide layer is implanted with nitrogen ions and then thermally annealed resulting in a hardened and densified field oxide. In subsequent operations, a sacrificial oxide layer is formed on the semiconductor top surface by thermal oxidation. Upon etching with hydrofluoric acid (HF), the etch rate of the hardened field oxide is significantly reduced relative to untreated field oxide. Thus, the exposed hardened field oxide is etched at about the same rate as the sacrificial oxide layer. In the example given, the etch rate of untreated densified TEOS field oxide in 10:1 HF is 6.90 Å/sec, while the etch rate of TEOS field oxide hardened according to the processes of this invention is 5.90 Å/sec. After planarization using the hardened field oxide, depressions in the isolation barrier are eliminated.

U.S. Pat. No. 5,447,884 (Fahey et al.) relates to a process for forming trench isolation in which the trench is etched in a reactive ion etching process, and lined with a thin liner nitride having a thickness <5 nanometers. A feature of the invention is the use of a pyrogenic oxide anneal (wet oxidation) at a temperature of about 80° C. This anneal densifies the oxide liner as is conventional, but at a much lower temperature than conventional argon annealing.

U.S. Pat. No. 5,492,858 (Bose et al.) discloses is a method of planarizing the surface of a silicon wafer in integrated circuit manufacture where shallow trench isolation techniques are employed. The etched trenches are first coated with a silicon nitride protective liner before the trenches and active area mesas are conformally coated with a layer of silicon oxide. The conformal oxide then is steam annealed to densify the conformal oxide, and then the surface of the silicon wafer is etched and polished back down to the tops of the active area mesas, to form a substantially planar surface.

SUMMARY OF THE INVENTION

An object of this invention is to provide a method of forming shallow trench isolation that reduces junction leakage at the boundary of shallow trench isolation and contact metallurgy of adjacent transistors.

Another object of this invention is to provide a method of forming shallow trench isolation that avoids a reduction of carrier concentration in the source and drain region of transistors adjacent to the shallow trench isolation.

To accomplish these and other objects the method to form a shallow trench isolation feature of an integrated circuit on the surface of a semiconductor substrate of this invention begins providing a semiconductor substrate having a surface coated with at least one layer of an insulating material and a plurality of shallow trenches formed in the surface of the semiconductor substrate. A nitrogen doped insulating layer is then grown on the internal surfaces or sidewalls of the shallow trenches. A gap fill insulating layer is deposited upon the surface of the semiconductor substrate to fill the shallow trenches, and the gap fill insulating layer is planarized to remove excess material of the gap fill insulating layer from the surface of the semiconductor substrate while leaving the gap fill insulating layer within the shallow trenches.

The nitrogen doped insulating layer is grown by treating the internal surfaces of the shallow trenches with an oxygen rich atmosphere such as steam ($H_2O$) and oxygen ($O_2$) gas followed by a nitrogen compound such as nitrogen gas ($N_2$), ammonia ($NH_3$), nitrous oxide ($N_2O$), and nitric oxide (NO).

Alternately, the oxygen rich atmosphere and the nitrogen compound are applied simultaneously to treat the internal surface of the shallow trenches.

The treating of the internal surfaces of the shallow trenches with the oxygen rich atmosphere of the shallow trenches is at a temperature from approximately 900° C. to approximately 1000° C., at a pressure of from approximately 600 Torr to approximately 760 Torr, for a period of time from 60 minutes to 120 minutes.

The treating the internal surfaces of the shallow trenches with the nitrogen com pounds is at a temperature of from approximately 900° C. to approximately 1000° C. at a pressure of from approximately 600 Torr to approximately 760 Torr for a period of time of from approximately 30 minutes to approximately 90 minutes.

The growing the nitrogen doped insulating layer on the internal surfaces of the shallow trenches is alternatively performed by exposing the internal surfaces to a mixture of nitrogen rich and oxygen rich compounds to thermally grow a silicon oxynitride layer on said internal surfaces of the shallow trenches. The mixture of nitrogen rich and oxygen compounds is at a temperature of from approximately 900° C. to approximately 1000° C., and at a pressure of from approximately 600 Torr to approximately 760 Torr for a period of from approximately 120 minutes to approximately 180 minutes. The mixture nitrogen rich and oxygen rich compounds include nitrogen ($N_2$) gas, ammonia ($NH_3$), nitric oxide (NO), and nitrous oxide ($N_2O$) and oxygen rich compounds are steam ($H_2O$) and oxygen ($O_2$).

The nitrogen doped insulating layer is grown to a thickness from approximately 10 nanometers to approximately 30 nanometers.

The gap fill insulating layer is CVD formed silicon oxide or spun-on-glass silicon dioxide. The planarizing is accomplished by chemical/mechanical planarization or by etching the gap fill insulating layer.

DETAILED DESCRIPTION OF THE INVENTION

Figure 1A:
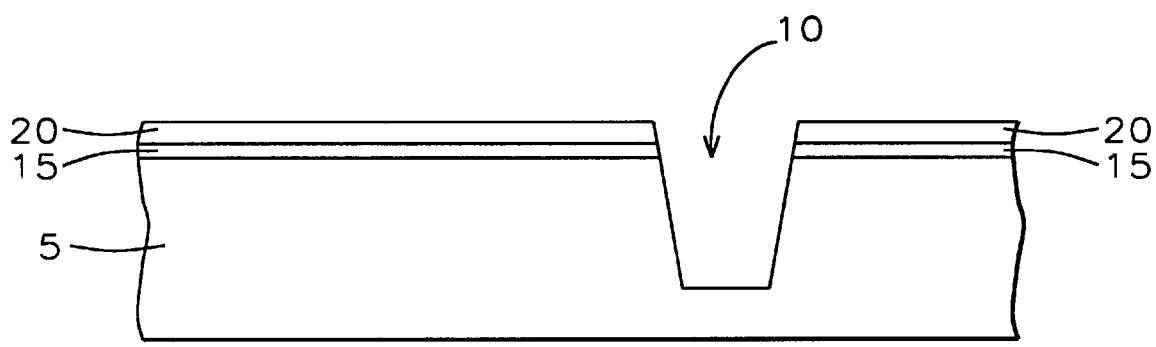
FIGS. 1a–1f are cross sectional diagrams showing the steps of forming a shallow trench isolation of this invention.
Figure 1B:
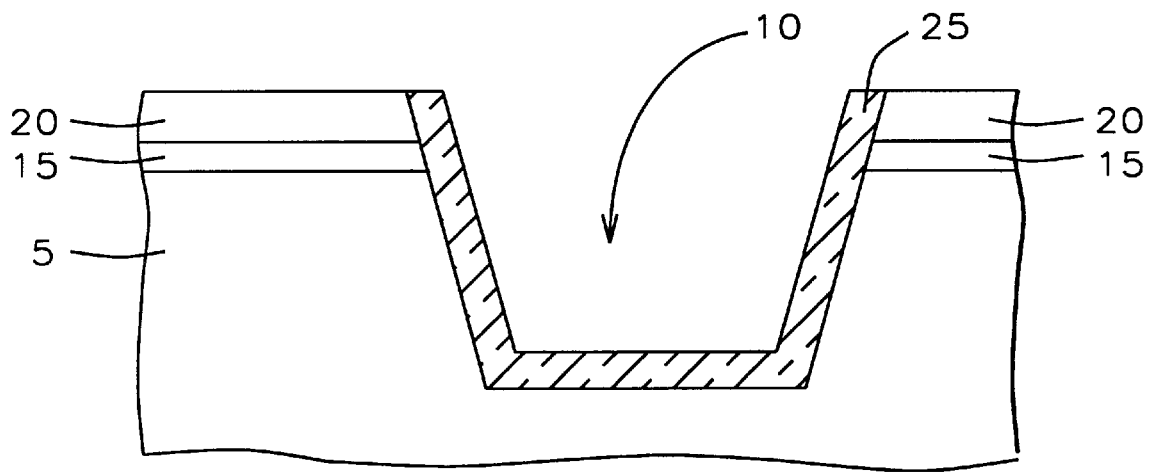

Refer now to FIGS. 1a–1f and FIG. 2 for a discussion of the method to form the shallow trench isolation of this invention. The method of this invention begins with providing 100 a semiconductor substrate as shown in FIG. 1a. The semiconductor substrate 5 has a first insulating layer 15 that is usually a silicon oxide ($SiO_x$) and a second insulating layer 20. The second insulating layer is conventionally a silicon nitride $Si_xN_y$ layer that will act as a planarization stop in later steps of this method. A trench 10 is formed by selectively etching the first insulating layer 15, the second insulating layer 20, and the semiconductor substrate 5.

An insulating liner 25 that is rich in nitrogen is grown 105 on the inner surface or sidewalls of the trench 10 as shown in FIG. 2b. The insulating liner 25 is formed by exposing the internal surfaces or sidewalls of the trenches 10 to an atmosphere that is a mixture of nitrogen ($N_2$) gas or nitrogen compounds such as ammonia ($NH_3$), nitric oxide (NO), and nitrous oxide ($N_2O$), and oxygen (O) rich compounds such as steam ($H_2O$) or oxygen ($O_2$) gas. The pressure of the atmosphere is from 600 Torr to 760 Torr and the temperature is from approximately 900° C. to approximately 1000° C. The period of time of exposure to the atmosphere is from approximately 120 minutes to approximately 180 minutes or until the insulating liner has achieved a thickness greater than 8 nanometers.

Alternately, the atmosphere is initially is an oxygen rich compound of either steam (H2O) or oxygen ($O_2$) gas applied at a temperature of from approximately 900° C. to approximately 1000° C. at a pressure of from approximately 600 Torr to 760 Torr. The period of exposure to the steam ($H_2O$) or oxygen ($O_2$) gas is from approximately 60 minutes to approximately 120 minutes. This above described process is equivalent to the conventional thermal oxide growth. The atmosphere of oxygen rich compound of steam ($H_2O$) or oxygen ($O_2$) gas is then replaced with an atmosphere of gaseous nitrogen compounds such as nitrogen ($N_2$) gas, ammonia ($NH_3$), nitric oxide (NO), and nitrous oxide ($N_2O$).

The gaseous nitrogen compounds are applied at a temperature of from approximately 900° C. to approximately 1000° C. and at a pressure of from approximately 600 Torr to approximately 760 Torr. The gaseous nitrogen compounds from approximately 30 minutes to approximately 90 minutes. The insulating layer will have a thickness greater than 10 nanometers.

The insulating liner 25 must be a form of silicon oxynitride ($Si_xO_yN_z$). If the insulating liner 25 were formed as strictly a silicon nitride ($Si_xN_y$), stresses due to the lattice mismatch of the silicon nitride ($Si_xN_y$) and the silicon (Si) of the semiconductor substrate 100 easily lead to the formation of defects around the trenches 10. The above described stresses are typically greater than $5 \times 10^9$ dynes/cm$^2$ in tension.

Figure 1C:
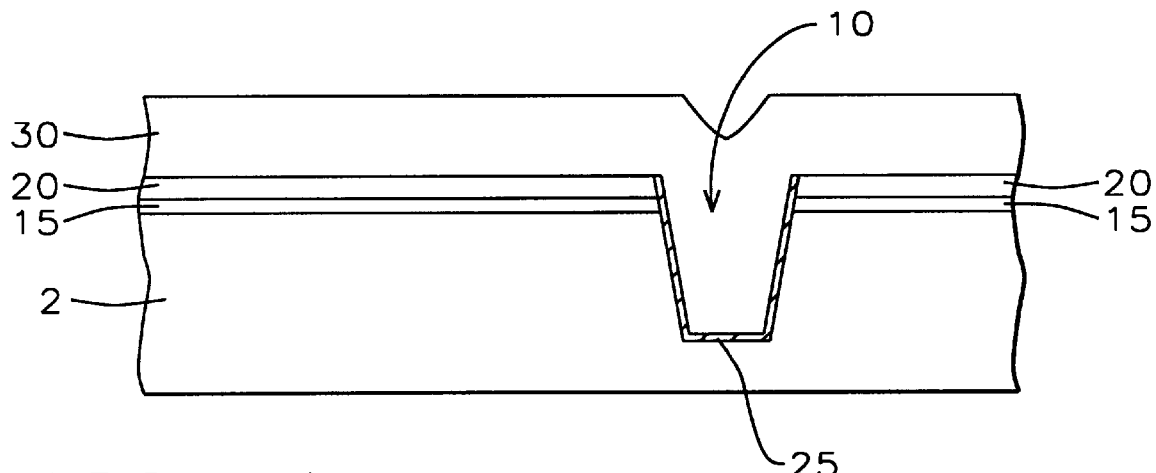

The next step is the deposition 110 of the gap fill layer 30 of FIG. 1c on the surface of the semiconductor substrate 5. The gap fill layer 30 is formed by conventional methods well known in the art. These methods include chemical vapor deposition (CVD) of ozone assisted tetraethylorthosilane ($O_3$-TEOS), spun-on-glass (SOG).

The gap fill layer 30 is silicon dioxide ($SiO_2$) or borophosilicate glass (BPSG).

The gap fill layer 30 is annealed 115 at a temperature of from approximately 800° C. to approximately 1200° C. for a period of time from approximately 60 minutes to approximately 120 minutes. The high temperature anneal causes the gap fill layer to become more dense.

Figure 1D:
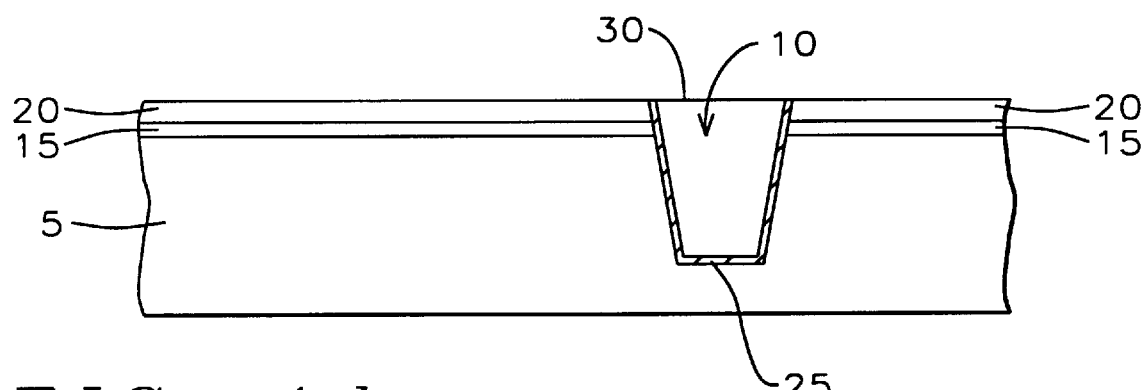
Figure 1E:
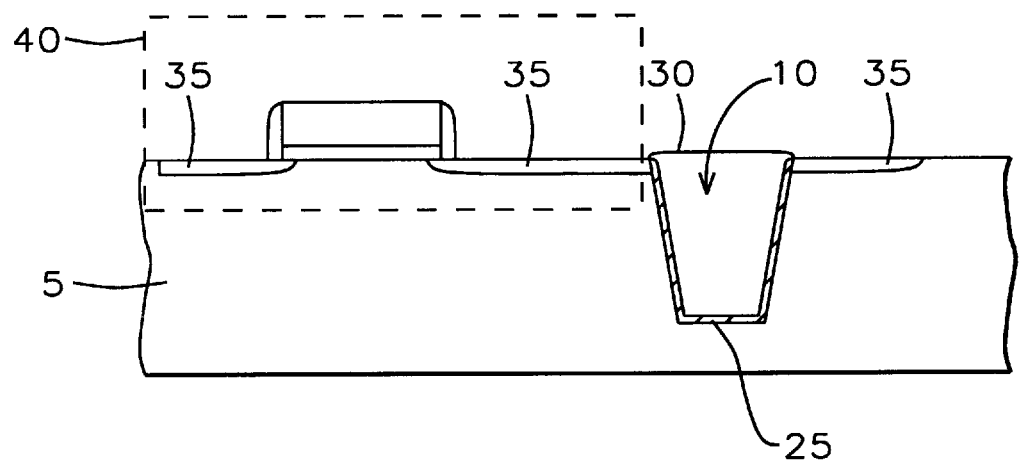
Figure 1F:
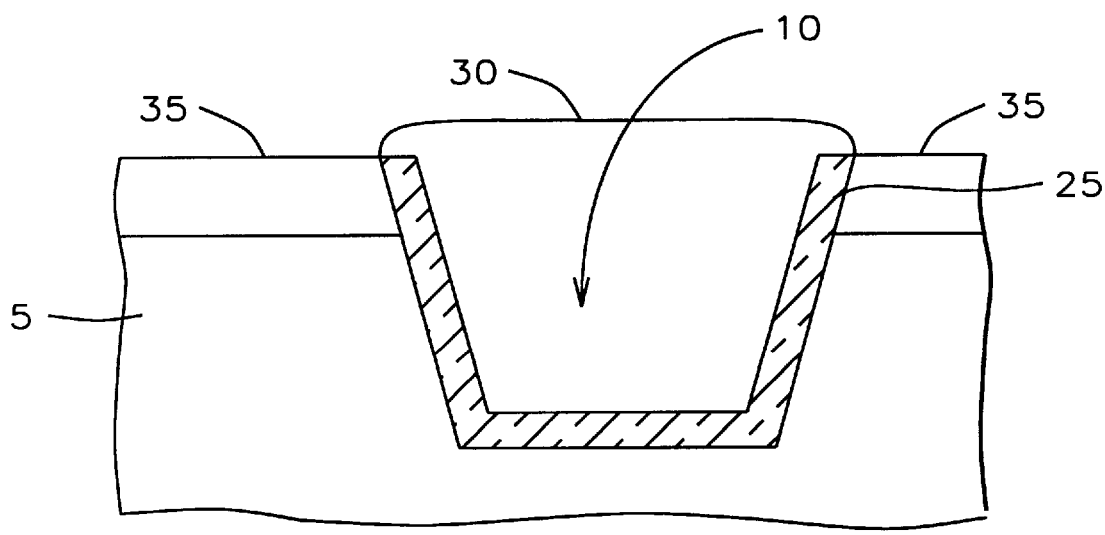
Figure 2:
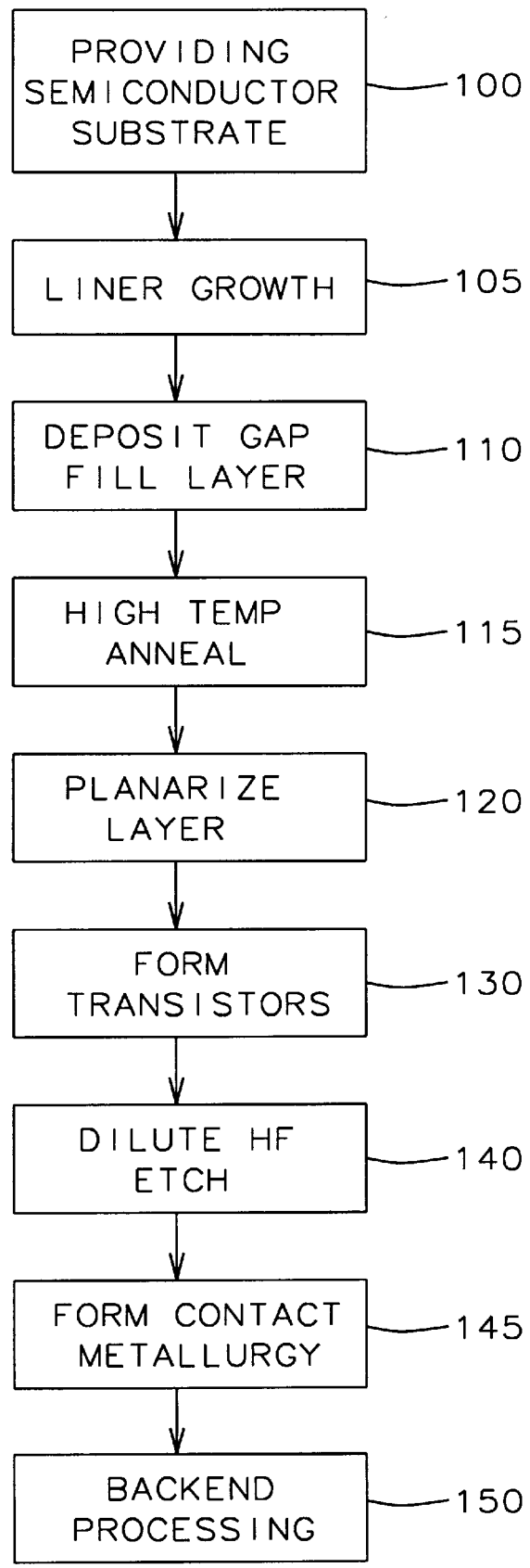
FIG. 2 is a flow chart of the method to form a shallow trench isolation of this invention.

After the high temperature anneal 115, the surface of the semiconductor substrate 5 is planarized 120 to remove the excess gap fill layer 30 from the surface of the semiconductor substrate as shown in FIG. 1d. The gap fill layer 30 fills the trenches 10 level to the top surface of the semiconductor substrate 5. The planarizing 120 of the gap fill layer 30 is performed by conventional methods of chemical/mechanical planarization (CMP) or by conventional wet etching techniques.

The method continues with conventional formation 130 of the transistors 40 of FIG. 1c on the surface of the semiconductor substrate. The source and drain 35 of the transistor 40 is formed by diffusing an impurity species such as boron (B) into the surface of the semiconductor substrate 5. As described above boron (B) will diffuse more readily into the gap fill layer 30. However, the boron (B) will be stopped by the nitrogen (N) present in the insulating liner 25. The process for the nitrogen (N) stopping the diffusion of the boron (B) into the gap fill layer 30 is similar to that of the process wherein the nitrided gate oxide is used to suppress the penetration of Boron (B) from a heavily doped polycrystalline silicon or amorphous silicon gate through the gate oxide to the silicon semiconductor substrate 5. This phenomena is well reported in the prior art.

The carrier concentration of the source and drain 35 at the sidewall of the trench 10 thus will not decrease to unacceptable levels and cause an increase in the junction leakage of the transistor 40.

Subsequent to the formation of the transistor 40, the surface of the semiconductor substrate 5 in the areas of the source and drain 35 has a dilute solution of hydrofluoric acid applied 140. The dilute solution of hydrofluoric acid is to remove any residual of the gap fill layer 30 from the surface of the semiconductor substrate 5 in the area of the source and drain 35. The insulating liner 25 will further act as a stop barrier to prevent further thinning of the gap fill layer 30, thus preventing increased junction leakage in the transistor 40.

The contact metallurgy is formed 145 by depositing either titanium (Ti) or cobalt (Co) or cobalt (Co) and an optional titanium nitride (TiN). A rapid thermal anneal (RTA) is performed on the contact metallurgy at a temperature of from approximately 500° C. to approximately 800° C. for a period of time from 20 seconds to 40 seconds. The contact metallurgy will be selectively etched and a second rapid thermal anneal (RTA) is performed. The second rapid thermal anneal is performed at a temperature of from approximately 650° C. to approximately 750° C. The aforementioned process will create a titanium salicide or cobalt salicide at the interface between the contact metallurgy and the source and drain 35.

The semiconductor substrate 5 is then processed through the back end processing 150 to complete the formation of the integrated circuit.

While this invention has been particularly shown and described with reference to the preferred embodiments thereof, it will be understood by those skilled in the art that various changes in form and details may be made without departing from the spirit and scope of the invention.

The invention claimed is:

1. A method to form a shallow trench isolation feature of an integrated circuit on the surface of a semiconductor substrate, comprising the steps of:

providing a semiconductor substrate having a surface coated with at least one layer of an insulating material and a plurality of shallow trenches formed in the surface of said semiconductor substrate;

growing a nitrogen doped insulating layer on internal surfaces of the shallow trenches, by exposing said internal surfaces to a nitrogen rich and oxygen rich atmosphere to thermally grow a silicon nitride layer on said internal surfaces of the shallow trenches;

depositing a gap fill insulating layer upon the surface of the semiconductor substrate to fill the shallow trenches; and planarizing the gap fill insulating layer to remove excess material of the gap fill insulating layer from the surface of the semiconductor substrate while leaving the gap fill insulating layer within the shallow trenches.

2. The method of claim 1 wherein growing the nitrogen doped insulating layer comprises the step of treating the internal surfaces of the shallow trenches with an oxygen rich atmosphere followed by a nitrogen compound selected from the group of nitrogen compounds consisting of nitrogen gas ($N_2$), ammonia ($NH_3$), nitrous oxide ($N_2O$), and nitric oxide.

3. The method of claim 2 wherein the oxygen rich atmosphere is selected from the atmosphere consisting of steam and oxygen gas.

4. The method of claim 2 wherein the treating of the internal surfaces of the shallow trenches with the oxygen rich atmosphere of the shallow trenches is at a temperature from approximately 900° C. to approximately 1000° C., at a pressure of from approximately 600 Torr to approximately to 760 Torr, for a period of time from 60 minutes to 120 minutes.

5. The method of claim 4 wherein the treating the internal surfaces of the shallow trenches with the nitrogen compounds is at a temperature of from approximately 900° C. to approximately 1000° C. at a pressure of from approximately 600 Torr to approximately 760 Torr for a period of time of from approximately 30 minutes to approximately 90 minutes.

6. The method of claim 1 wherein the nitrogen rich and oxygen rich atmosphere is at a temperature of from approximately 900° C. to approximately 1000° C., and at a pressure of from approximately 600 Torr to approximately 760 Torr for a period of from approximately 120 minutes to approximately 180 minutes.

7. The method of claim 1 wherein the nitrogen rich and oxygen rich atmosphere includes nitrogen compounds selected from the set of nitrogen compounds consisting of nitrogen ($N_2$) gas, ammonia ($NH_3$), nitric oxide (NO), and nitrous oxide ($N_2O$) and oxygen rich compounds selected from the set of oxygen rich compounds consisting of steam ($H_2O$) and oxygen($O_2$).

8. The method of claim 1 wherein the gap fill insulating layer is selected from insulating materials consisting of CVD formed silicon oxide and spun-on-glass silicon dioxide.

9. The method of claim 1 wherein the planarizing is accomplished by chemical/mechanical planarization.

10. The method of claim 1 wherein the planarizing is accomplished by etching the gap fill insulating layer.

11. The method of claim 1 wherein the nitrogen doped insulating layer has a thickness from approximately 10 nanometers to approximately 30 nanometers.

* * * * *